(12) United States Patent
Zhu

(10) Patent No.: US 8,741,703 B2
(45) Date of Patent: Jun. 3, 2014

(54) METHOD FOR MANUFACTURING FINFET WITH IMPROVED SHORT CHANNEL EFFECT AND REDUCED PARASITIC CAPACITANCE

(71) Applicant: Institute of Microelectronics, Chinese Academy of Sciences, Beijing (CN)

(72) Inventor: Huilong Zhu, Poughkeepsie, NY (US)

(73) Assignee: Institute of Microelectronics, Chinese Academy of Sciences, Beijing (CN)

(*) Notice: Subject to any disclaimer, the term of this patent is extended or adjusted under 35 U.S.C. 154(b) by 0 days.

(21) Appl. No.: 14/029,157

(22) Filed: Sep. 17, 2013

(65) Prior Publication Data
US 2014/0011330 A1   Jan. 9, 2014

Related U.S. Application Data

(62) Division of application No. 12/865,220, filed as application No. PCT/CN2010/074392 on Jun. 24, 2010, now Pat. No. 8,552,477.

(30) Foreign Application Priority Data

Sep. 30, 2009   (CN) .......................... 2009 1 0235339

(51) Int. Cl.
*H01L 21/00* (2006.01)

(52) U.S. Cl.
USPC ...................................................... 438/158

(58) Field of Classification Search
USPC ........... 257/67, 288, 347, 353, 355, 618, 619, 257/E29.255, E27.112, E21.32, E21.561; 438/151, 158
See application file for complete search history.

(56) References Cited

U.S. PATENT DOCUMENTS

| 6,413,802 B1 | 7/2002 | Hu et al. |
| 6,458,662 B1 | 10/2002 | Yu |
| 2005/0110085 A1* | 5/2005 | Zhu et al. ...................... 257/347 |

(Continued)

FOREIGN PATENT DOCUMENTS

CN   101267001   9/2008

OTHER PUBLICATIONS

Search Report and Written Opinion for PCT Application No. PCT/CN2010/074392, dated Oct. 21, 2010, 7 pages.

(Continued)

*Primary Examiner* — Selim Ahmed
(74) *Attorney, Agent, or Firm* — Westman, Champlin & Koehler, P.A.

(57) ABSTRACT

The present application discloses a method for manufacturing a semiconductor device. The method may comprise providing a fin in a semiconductor layer of a SOI substrate, and providing a stack of gate dielectric and gate conductor on only a first side of the fin. The gate conductor may extend laterally away from the first side of the fin in a gate extending direction. The method may comprise doping the fin at its other two opposing sides so as to provide a source region and a drain region. Each of the source and drain regions may have a portion extending laterally away from a second side, opposite to the first side, of the fin in a source/drain extending direction. The gate extending direction and the source/drain extending direction can be parallel to the main surface of the SOI substrate, while being opposite to each other. The method may comprise providing a channel region at a central portion of the fin.

10 Claims, 13 Drawing Sheets

(56) References Cited

U.S. PATENT DOCUMENTS

| | | |
|---|---|---|
| 2005/0145941 A1 | 7/2005 | Bedell et al. |
| 2006/0027870 A1 | 2/2006 | Inaba |
| 2008/0001227 A1 | 1/2008 | Zhu et al. |
| 2008/0061370 A1 | 3/2008 | Matsuo |
| 2008/0290391 A1* | 11/2008 | Hsu et al. .................. 257/315 |
| 2011/0193164 A1 | 8/2011 | Zhu |

OTHER PUBLICATIONS

Chinese Office Action for Chinese Application No. CN 200910235339.9, dated Nov. 17, 2011, 5 pages.

* cited by examiner

METHOD FOR MANUFACTURING FINFET WITH IMPROVED SHORT CHANNEL EFFECT AND REDUCED PARASITIC CAPACITANCE

This application is a divisional application of U.S. Ser. No. 12/865,220 filed on Sep. 7, 2010, which is a Section 371 National Stage Application of International Application No. PCT/CN2012/074392, filed Jun. 24, 2010, published in the international stage as WO 2011/038598 on Apr. 7, 2011, which is based on, and claims priority from Chinese Patent Application Serial No. 200910235339.9, filed on Sep. 30, 2009, entitled "Semiconductor Device and Method for Manufacturing the Same", the contents of which are incorporated herein by reference in their entirety.

BACKGROUND OF THE INVENTION

1. Field of Invention

The present invention relates to a semiconductor device and a method for manufacturing the same, in particular, to an improved FinFET formed on a semiconductor-on-insulator (SOI) substrate.

2. Description of Prior Art

One important trend in the integrated circuits is scaling down of metal-oxide-semiconductor field effect transistors (MOSFETs) so as to achieve a high integration degree of devices and reduce a cost of manufacture. However, it is well known that short channel effect occurs with a reduced size of the MOSFET, due to which, when the size of the MOSFET is reduced, the gate of the MOSFET has a smaller effective length and actually controls less charges in a depletion region with an applied gate voltage. Consequently, the MOSFET has a reduced threshold voltage with a reduced channel length.

A conventional planar MOSFET has a tri-layer structure including a gate electrode, a semiconductor layer, and a gate dielectric sandwiched therebetween. A channel region is provided in the semiconductor layer below the gate electrode, and source/drain regions are provided in the semiconductor layer adjacent to and at two opposing sides of the channel region. A silicide layer may be provided on the source/drain regions and then coupled with source/drain electrodes through vias so as to reduce a parasitic resistance or a parasitic capacitance of the device. The planar MOSFET suffers from the short channel effect and has a threshold voltage fluctuating with variation of the channel length.

To suppress the short channel effect, U.S. Pat. No. 6,413,802 discloses a FinFET formed on a SOI substrate, comprising a channel region provided in a central portion of a fin of semiconductive material and source/drain regions provided at two ends of the fin. A gate electrode is provided at both sides of the channel region and surrounds the latter to provide for example a double gate FinFET. inversion channels are induced at both sides of the fin. The channel region in the fin has a small thickness so that the whole channel region is controlled by the gate, as a result of which, the short channel effect is suppressed.

However, in a conventional FinFET, the gate is provided between and extends parallel to the source/drain regions. Since the distance between the source/drain regions and the gate is typically small sufficient for a capacitive couple introduced therebetween, the resultant device has a large parasitic resistance and capacitance.

Moreover, the capacitive coupling between the source/drain regions and the gate limits the freedom of device design. For example, if one attempts to reduce a parasitic resistance, a thickness of the source/drain regions should be increased. However, the source/drain regions having a larger thickness also means an increased coupling area between the source/drain regions and the gate, which in turn causes a parasitic capacitance to increase, or vice versa. Thus, one skilled person in the art can not reduce both of the parasitic resistance and the parasitic capacitance together in a conventional FinFET.

Consequently, the conventional FinFET has a delay due to a large value of the time constant RC and thus has a low switching speed.

SUMMARY OF THE INVENTION

One object of the present invention is to provide a semiconductor device which can suppress the short channel effect while reducing the parasitic resistance and capacitance.

Another object of the present invention is to provide a semiconductor device which has improved electrical properties due to the induced stress.

According to one aspect of the invention, there is provided a semiconductor device formed on a SOI substrate comprising a buried insulating layer and a semiconductor layer on the buried insulating layer, wherein a fin of semiconductive material having two opposing sides perpendicular to a main surface of the SOI substrate is provided in the semiconductor layer, said semiconductor device comprising: a source region and a drain region provided at two ends of the fin respectively; a channel region provided at a central portion of the fin; and a stack of gate dielectric and gate conductor provided at one side of the fin, where the gate conductor is isolated from the channel region by the gate dielectric, wherein the gate conductor extends away from the one side of the fin in a direction parallel to the main surface of the SOI substrate.

According to another aspect of the invention, there is provided a method for manufacturing a semiconductor device, comprising steps of: a) providing a fin of semiconductive material in a semiconductor layer of a SOI substrate by a self-alignment process, the fin having two opposing sides perpendicular to the main surface of the SOI substrate; b) providing a stack of gate dielectric and gate conductor on one side of the fin, the gate conductor extending away from the one side of the fin in a direction parallel to the main surface of the SOI substrate; c) doping the semiconductor material of the fin at its two ends so as to provide a source region and a drain region respectively; and d) providing a channel region at a central portion of the fin.

It should be noted that the inventive semiconductor device includes a fin of semiconductive material but has a structure different from the conventional FinFET, because it's gate is provided at only one side of the fin and extends away from the one side of the fin. As a comparison, the conventional FinFET typically has a double gate structure which surrounds a channel region at the central portion of fin. Moreover, in the present invention, the source/drain regions are provided at two ends of the fin and extend in a direction opposite to the direction in which the gate extends.

Since in the inventive semiconductor device the gate does not extend between the source/drain regions parallel to the source/drain regions, there is no capacitive coupling between the source/drain regions and the gate. Thus, the inventive semiconductor device has a reduced parasitic capacitance. Meanwhile, the inventive semiconductor device allows a reduced parasitic resistance by providing source/drain regions having a relatively larger thickness.

The inventive semiconductive device also allows further suppression of the parasitic effect relevant with the parasitic capacitance and the parasitic resistance by providing extensions adjacent to the channel region in the fin so as to decrease a length of electrical conduction of the charge carriers.

Moreover, the inventive semiconductive device can have an increased switching speed by providing stressors for the source/drain regions so as to induce stress in the channel region.

For the purpose of effectively controlling the short channel effect, the channel region is provided with self-aligned process and has a small thickness, for example in the range of 5-40 nm. Preferably, a supper steep retrograde well (SSRW) is used so as to decrease the thickness of the channel region. Even in a case where the gate is provide at only one side of the fin, the gate can completely control the channel region and suppress the short channel effect.

DETAILED DESCRIPTION OF PREFERRED EMBODIMENTS

Figure 1A:
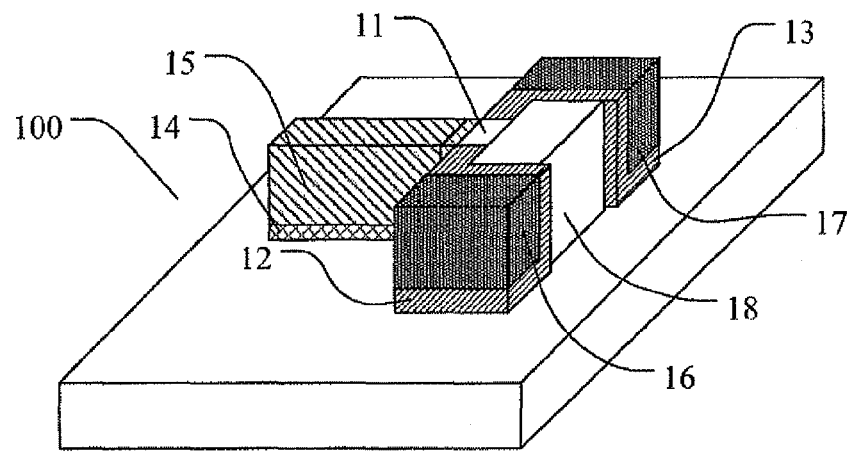
FIG. 1A and 1B are a perspective view and a top view respectively of a structure of a semiconductor device according to an embodiment of the present invention, wherein the top view shows lines A-A', 1-1' and 2-2' for taking cross sections of the following figures.

Reference will now be made in detail to the preferred embodiments of the present invention, examples of which are illustrated in the accompanying drawings, wherein like reference numerals refer to same elements throughout. The figures are not drawn to scale, for the sake of clarity.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be "under" or "below" the other layer or region.

In contrast, when one layer is referred to as being "directly on" or "on and adjacent to" another layer or region, there are not intervening layers or regions present.

Some particular details of the invention will be described, such as an exemplary structure, material, dimension, process step and fabricating method of the device, for a better understanding of the present invention. Nevertheless, it is understood by one skilled person in the art that these details are not always essential for but can be varied in a specific implementation of the invention Unless the context clearly indicates otherwise, each part of the semiconductor device can be made of material(s) well-known to one skilled person in the art. As an initial structure, a SOI substrate can be for example silicon-on-insulator substrate, silicon germanium-on-insulator substrate, or multilayer semiconductor-on-insulator substrate. The multilayer semiconductor includes for example group-III-V semiconductor, such as GaAs, InP, GaN, SiC. A gate conductor can be for example a metal layer, a doped polysilicon layer, or a multilayer gate conductor including a metal layer and a doped polysilicon layer. The metal layer is made of one selected from a group consisting of TaC, TiN, TaTbN, TaErN, TaYbN, TaSiN, HfSiN, MoSiN, RuTax, NiTax, MoNx, TiSiN, TiCN, TaAlC, TiAlN, TaN, PtSix, Ni3Si, Pt, Ru, Ir, Mo, HfRu, RuOx, and their combinations. A gate dielectric is made of $SiO_2$ or other dielectric insulation material which has a dielectric constant larger than that of $SiO_2$, such as an oxide, a nitride, an oxynitride, a silicate, an aluminate, and a titanate. The oxide includes for example $SiO_2$, $HfO_2$, $ZrO_2$, $Al_2O_3$, $TiO_2$, $La_2O_3$. The nitride includes for example $Si_3N_4$. The silicate includes for example HfSiOx. The aluminate includes for example $LaAlO_3$. The titanate includes for example $SrTiO_3$. The oxynitride includes for example SiON. Moreover, the gate dielectric can be made of those developed in the future, besides the above known materials.

Figure 1B:
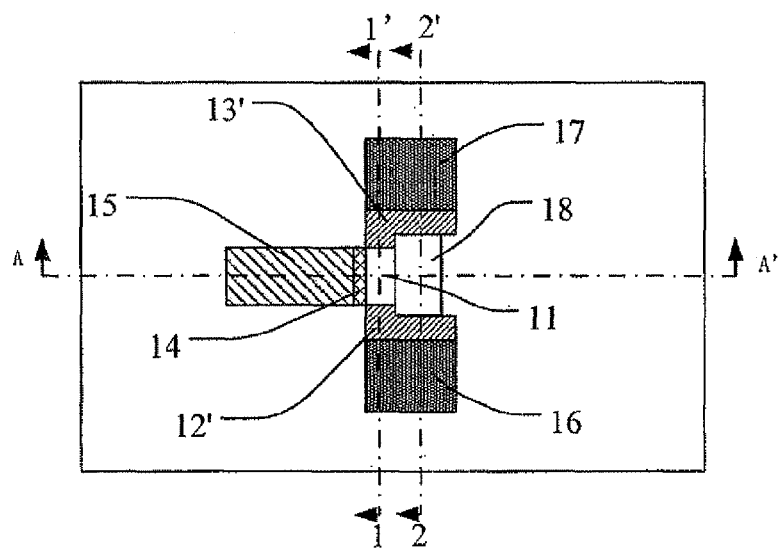

FIG. 1A and 1B are perspective and top views respectively of a structure of a semiconductor device according to an embodiment of the present invention. Lines A-A, 1-1' and 2-2' in FIG. 1B indicate where the following cross-sectional views are taken. Specifically, line A-A' is perpendicular to a length direction of a channel region and through a gate, line 1-1' is parallel to the length direction of the channel region and through the channel region, and line 2-2' is also parallel to the length direction of the channel region but through an insulating filler between source/drain regions.

Referring to FIGS. 1A and 1B, a semiconductor device 100 is formed in a semiconductor layer of a SOI substrate, which comprises a channel region 11 at a central portion of a fin of semiconductive material, a source region 12 and a drain region 13 at two ends of the fin respectively, a stack of a gate 15 and a gate dielectric 14 disposed adjacent to one side of the fin, and an insulating filler 18 for filling a trench at the other side of the fin.

The channel region at the central portion of the fin has relatively small thickness, for example in a range of about 5-40 nm. The thickness of the channel region is approximately equal to that of the conventional FinFET and provided with a similar self-aligned process.

The inventor has found that the gate at one side of the fin, instead of a double gate configuration, can still control the whole channel region and thus suppress the short channel effect if the thickness of the channel region is set to be in the above range.

Preferably, the semiconductor device further includes stressors 16, 17 which apply stress to the source region 12 and the drain region 13 respectively. The stressors 16, 17 contact the source region 12 and the drain region 13 respectively, with a contact area as large as possible so that a contact resistance between the stressors 16, 17 and the source region 12 and the drain region 13 can be minimized. As shown in FIGS. 1A and 1B, the source region 12 and the drain region 13 include trenches where the stressors 16, 17 are disposed with one side and a bottom thereof in contact with the source region 12 and the drain region 13.

The stressors 16, 17 are made of a material inducing a stress in the channel region, which has beneficial effect on electrical property of the transistor. In a case of an n-type MOSFET, the stressors 16, 17 should apply tensile stress towards the channel region in a direction parallel to the source and drain regions so as to maximize mobility of electrons which function as charge carriers. On the other hand, in a case of a p-type MOSFET, the stressors 16, 17 should apply compressive stress towards the channel region in a direction parallel to the source and drain regions so as to maximize mobility of holes which function as charge carriers.

It should be noted that the exemplary structure of the semiconductor device shown in FIGS. 1A and 1B includes stressors 16, 17 located in conduction paths between the source region 12 and a source contact (not shown), and between the drain region 13 and a drain contact (not shown). Thus, the stressors 16, 17 are also electrically conductive. For an n-type MOSFET, Si:C doped with As or P can be used as a material of the stressors. For a p-type MOSFET, SiGe doped with B can be used as a material of the stressors.

Additional layers and portions of the semiconductor device, which are disposed above the source region 12, the drain region 13 and the gate 15, are not shown in FIGS. 1A and 1B, such as gate spacers, a silicide layer, a source contact, a drain contact, a gate contact, an interlayer insulator and vias formed therein, and a passivation layer.

In the following contents regarding the process steps of fabricating the semiconductor device, some of the above additional layers and portions related to the semiconductor device will be described, but detailed description of those additional layers or portions (for example a source contact, a drain contact, and a gate contact) well known to one skilled person are omitted. For simplicity, the structure of the semiconductor device having been subject to several relevant process steps may be shown in one figure.

Figure 2:
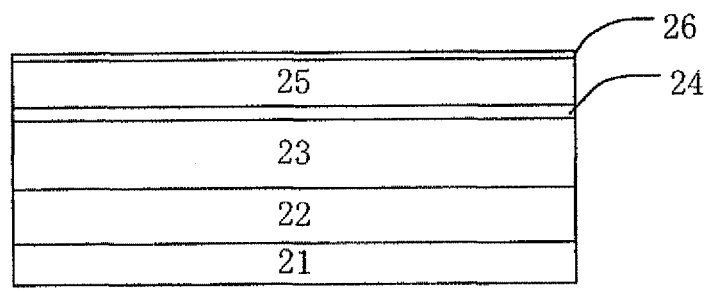
FIGS. 2-9 are cross-sectional views of the structure of the semiconductor device at various stages of fabrication process according to an embodiment of the present invention, taken along line A-A' and for illustrating the process steps of forming a fin and a gate.

Referring to FIG. 2, a method of manufacturing semiconductor device according to an embodiment of the present invention starts with an SOI wafer which is a stack of a bottom substrate 21, a buried oxide layer (BOX) 22 and a top semiconductor layer 23.

By a conventional deposition process, such as PVD, CVD, atomic layer deposition, sputtering and the like, a SiGe layer 24 which has a Ge content of about 5-15% and a thickness of about 3-20 nm and a Si layer 25 which has a thickness of about 30-100 nm are epitaxially grown in sequence on the SOI wafer. The Si layer 25 can be formed either in an independent deposition process or in-situ by using a Si target or a precursor in the same chamber after the SiGe layer 24 is epitaxially grown.

Then, a $HfO_2$ layer 26 which has a thickness of about 3-10 nm is formed on the Si layer 25 by atomic layer deposition or magnetron sputtering.

Figure 3:
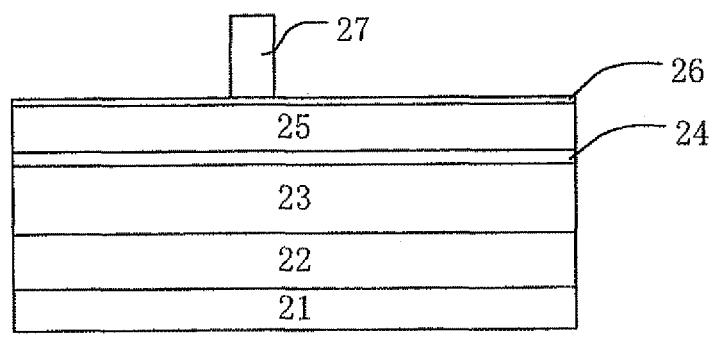

Referring to FIG. 3, by a conventional lithographical process including exposure and development steps, a photoresist pattern 27 in form of a stripe is formed on the $HfO_2$ layer 26.

Figure 4:
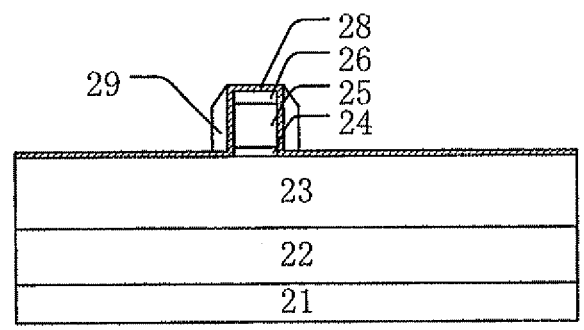

Referring to FIG. 4, with the photoresist pattern 27 as a mask, portions of the $HfO_2$ layer 26, the Si layer 25, and the SiGe layer 24 are selectively removed in sequence by dry etching such as ion beam milling, plasma etching, reactive ion etching, laser ablation and the like, so as to provide a stacked structure of the $HfO_2$ layer 26, the Si layer 25, and the SiGe layer 24 in a stripe pattern.

Two steps may be involved if the reactive ion etching is performed. At the first step, the portions of the $HfO_2$ layer 26 and the Si layer 25 are selectively removed with the SiGe layer 24 as a stop layer, by choosing a suitable gas in an etching atmosphere. At the second step, a portion of the SiGe layer 24 is further selectively removed with the top semiconductor layer 23 of the SOI substrate as a stop layer, by changing to another type of gas in the etching atmosphere. It is well known to one skilled person that one of the SiGe layer and the Si layer can be selectively removed by, controlling an etch selectivity with a different type of gas in an etching atmosphere being used in the reactive ion etching process.

Then, the photoresist pattern 27 is removed by ashing or dissolution with a solvent.

A conformal thin oxide layer 28 which has a thickness of about 2-5 nm is formed on the stacked structure in the stripe pattern and on a exposed portion of the top semiconductor layer 23 of the SOI substrate.

The thin oxide layer can be formed by a conventional deposition process, such as PVD, CVD, atomic layer deposition, sputtering and the like.

Then, a conformal nitride layer is firstly formed and then has a portion thereof being removed so as to provide nitride spacers 29 which has a thickness of about 5-50 nm at both sides of the stacked structure comprising the $HfO_2$ layer 26, the Si layer 25 and the SiGe layer 24.

Figure 5:
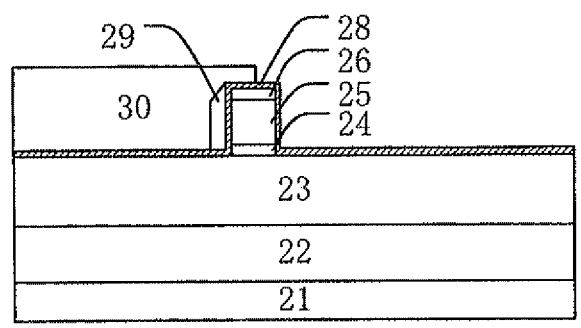

Referring to FIG. 5, by a conventional lithographical process including exposure and development steps, a photoresist pattern 30 is formed on the structure shown in FIG. 4 so as to mask the spacer at the left side of the stacked structure and its left portion.

Figure 6:
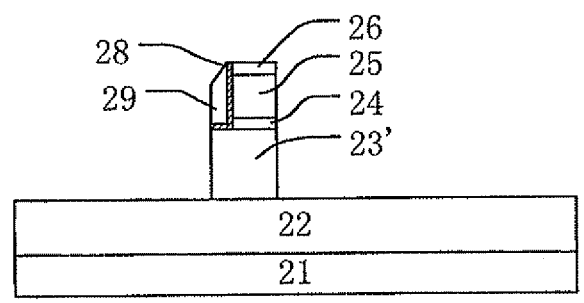

Referring to FIG. 6, with the photoresist pattern 30 as a mask, the spacer at the right side of the stacked structure is removed by an isotropic etching process, such as conventional wet etching using a solution of etchant.

Alternatively, the spacer at the right side of the stacked structure can be removed in three steps. At the first step, with the photoresist pattern 30 as a mask, an angular implantation of Ge is performed so as to cause damages in the spacer at the right side of the stacked structure. At the second step, the photoresist pattern 30 is removed by ashing or dissolution with a solvent. At the third step, by wet etching or dry etching, the spacer at the right side is selectively removed relative to the spacer at the left side.

After the spacer at the right side of the stacked structure is removed, the portion of the thin oxide layer 28 that is exposed on the main surface of the semiconductor structure is selectively removed by choosing a suitable gas in an etching atmosphere for example in an reactive ion etching. Then, with the remaining portion of the thin oxide layer 28, the spacer 29 at the left side of the stacked structure and the stacked structure comprising the $HfO_2$ layer 26, the Si layer 25 and the SiGe layer 24 as a hard mask, an exposed portion of the top semiconductor layer of the SOI substrate is selectively removed by changing to another type of gas in the etching atmosphere for example in the reactive ion etching, so as to provide a fin 23' of semiconductive material in a self-aligned manner.

Figure 7:
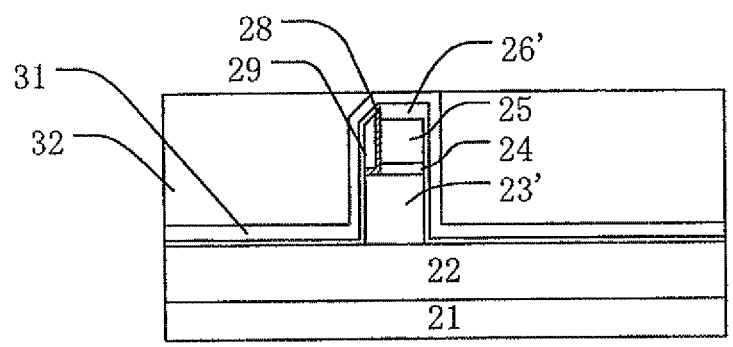

Referring to FIG. 7, by CVD or atomic layer deposition for example, a conformal thin oxide (for example, $HfO_2$) layer 26' which has a thickness of about 2-4 nm, a conformal metal (for example, TiN, which is a metal ceramic) layer 31 which has a thickness of about 3-10 nm, and a blanket polysilicon layer 32 are formed in sequence on the main surface of the semiconductor structure shown in FIG. 6. The conformal thin oxide layer 26' will provide a gate dielectric, and the conformal metal layer 31 and the polysilicon layer 32 constitutes a multiplayer gate conductor.

Preferably, the polysilicon layer 32 can be in-situ doped so as to improve an electrical conductivity.

The polysilicon layer 32 covers the whole top of the semiconductor structure. Then, the polysilicon layer 32 is subjected to a planarization process such as chemical mechanical polishing (CMP). The CMP stops at the top of the metal layer of the multilayer gate conductor so as to provide a flat surface for the semiconductor structure.

Figure 8:
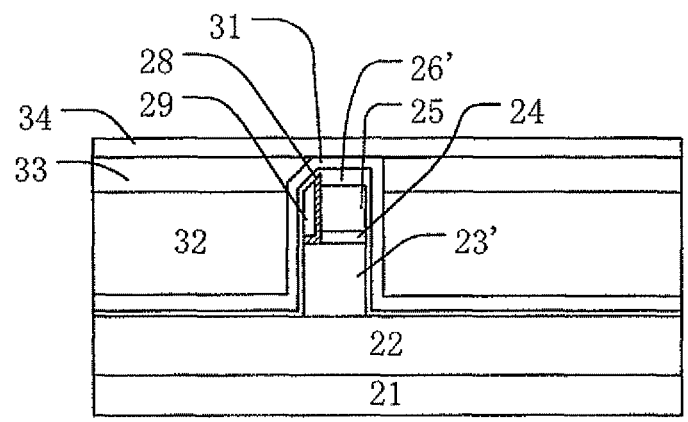

Referring to FIG. 8, by wet etching or dry etching, a portion of the polysilicon layer 32 is selectively removed relative to the metal layer 31 so that the polysilicon layer 32 is etched back. Then, for example by CVD, a blanket oxide layer 33 is formed on the whole surface of the semiconductor structure.

The oxide layer 33 is subjected to CMP which stops at the top of the metal layer of the multilayer gate conductor so as to provide a flat surface for the semiconductor structure. Consequently, the oxide layer 33 fills the portion of the polysilicon layer 32 removed by etching back.

Then, for example by CVD, a nitride layer 34 is formed on the main surface of the semiconductor structure.

Figure 9:
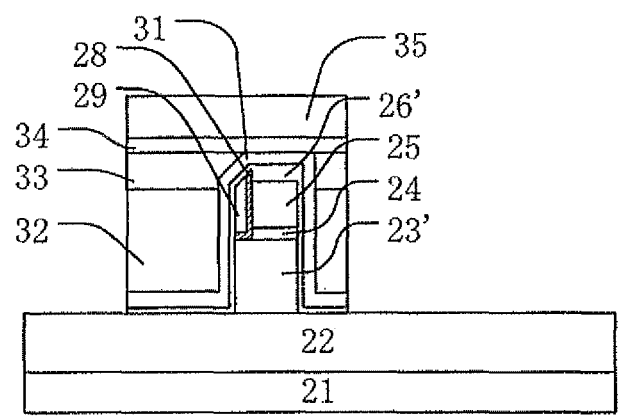

Referring to FIG. 9, by a conventional lithographical process including exposure and development steps, a photoresist pattern 35 in form of a stripe is formed for defining a gate region of the device, the multilayer gate conductor comprising the metal layer 31 and the polysilicon layer 32.

Then, with the photoresist pattern 35 as a mask and the buried oxide layer (BOX) 22 of the SOI wafer as a stop layer, portions of the nitride layer 34, the oxide layer 33, the polysilicon layer 32, the metal layer 31 and the thin oxide layer 26' that are located outside of the fin 23' are removed in sequence by dry etching, such as ion beam milling, plasma etching, reactive ion etching, laser ablation and the like.

Figure 10:
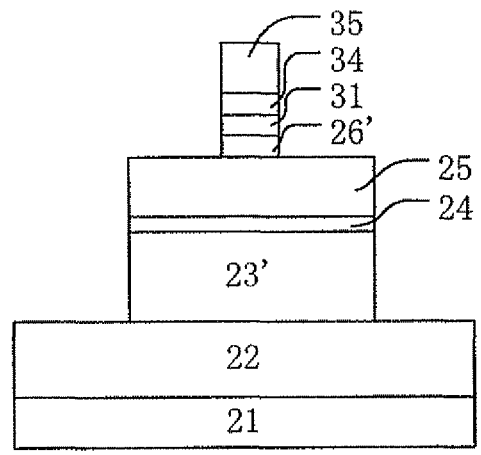
FIGS. 10-16 are cross-sectional views of the structure of the semiconductor device at various stages of the subsequent fabrication process according to an embodiment of the present invention, taken along line 1-1' and for illustrating the process steps of forming source/drain regions.

Corresponding to the cross sectional view of the semiconductor structure along line A-A shown in FIG. 9, FIG. 10 shows the cross sectional view of the semiconductor structure along line 1-1'. In the etching step with the photoresist pattern 35 as a mask, a stack of the nitride layer 34, the oxide layer 33, the polysilicon layer 32, the metal layer 31, and the thin oxide layer 26' is provided on the Si layer 25.

Before or after the above etching step, an additional masking step and an additional etching step can be involved so as to remove portions of the fin 23', the SiGe layer 24 and the Si layer 25 for defining a length of the fin. FIG. 10 shows the dimension of the length of the fin 23' in a horizontal direction after that.

Figure 11:
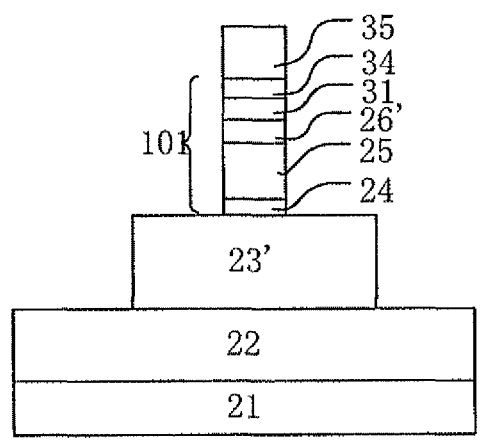

Referring to FIG. 11, still with the photoresist pattern 35 as a mask, portions of the Si layer 25 and the SiGe layer 24 are selectively removed in sequence by dry etching such as ion beam milling, plasma etching, reactive plasma etching, laser ablation and the like, which stops at the top of the fin 23'. Consequently, a stack 101 of layers including the nitride layer 34, the oxide layer 33, the polysilicon layer 32, the metal layer 31, the thin oxide layer 26', the Si layer 25 and the SiGe layer 24 is provided on the fin 23'.

Figure 12:
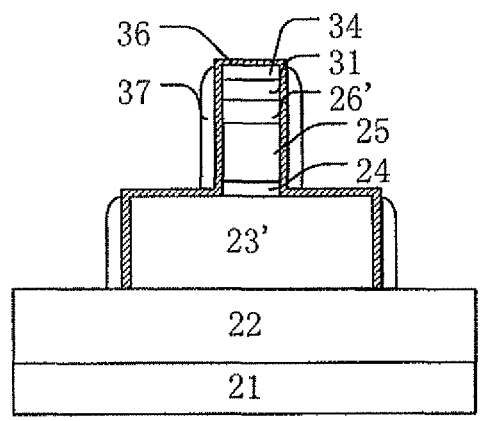

Referring to FIG. 12, the photoresist pattern 35 is removed by ashing or dissolution with a solvent.

Then, for example by CVD, a conformal oxide layer 36 which has a thickness of about 2-5 nm and a conformal nitride layer 37 which has a thickness of about 10-20 nm are formed, in sequence on the whole surface of the semiconductor structure.

By dry etching, such as ion beam milling, plasma etching, reactive ion etching, laser ablation and the like, a portion of the nitride layer 37 is removed, with the oxide layer 36 as a stop layer, so as to form nitride spacers 37 at both sides of the fin 23' and the stack of layers 101 respectively.

Figure 13:
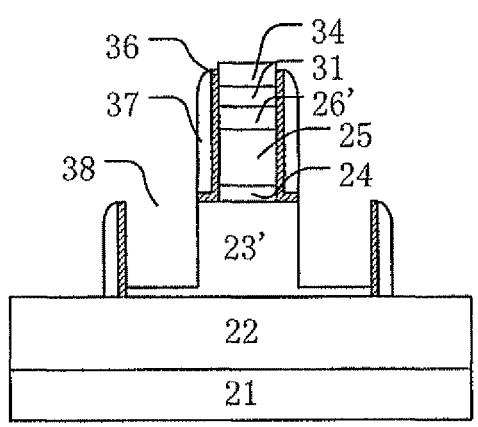

Referring to FIG. 13, with the stack of layers 101 and the nitride spacers 37 as a hard mask, a portion of the oxide layer 36 exposed at the main surface and a portion of the semiconductive material of the fin 23' are removed by dry etching, such as ion beam milling, plasma etching, reactive ion etching, laser ablation and the like, so as to provide trenches 38 at two ends of the fin 23' in its length direction (i. e. a horizontal direction in the drawing). A thin layer of semiconductive material, which has a thickness of about 10 nm, remains at the bottom of the trenches 38.

The etching step is performed in a self-aligned manner, where the size of the trenches 38 is defined by the oxide layer 36 and the nitride spacers 37.

Figure 14:
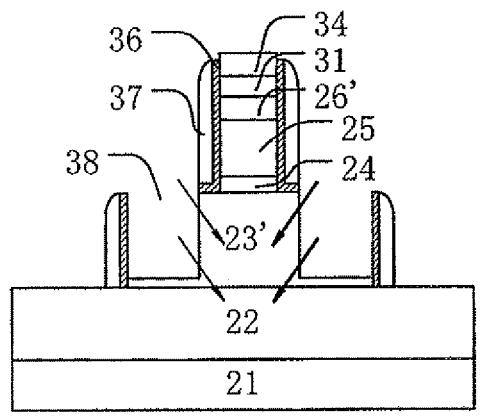

FIG. 14 shows an optional step of the manufacturing method according to some embodiments, in which an angular ion implantation is performed through the trenches 38 towards to the central portion of the fin 23' so as to provide halos in channel or in the substrate below the channel (i. e. a halo implantation). As a dopant for an n-type MOSFET, B or $BF_2$ may be used. As a dopant for a p-type MOSFET, As or P may be used.

Figure 15:
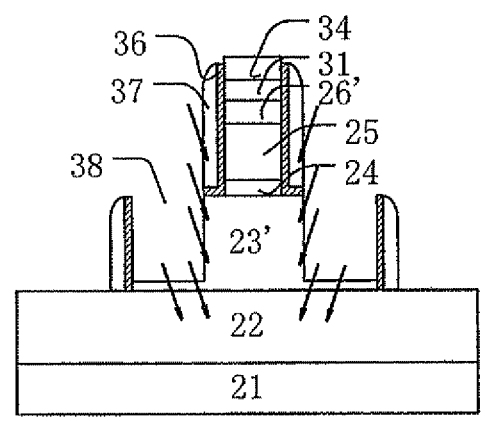

FIG. 15 shows an optional step of the manufacturing method according to some embodiments, in which an angular ion implantation is performed through the trenches 38 towards to the central portion of the fin 23' so as to provide source/drain extensions (i. e. an extension implantation). As a dopant for an n-type MOSFET, As or P may be used. As a dopant for a p-type MOSFET, B or $BF_2$ may be used.

Compared with the halo implantation, the extension implantation uses a relatively small implantation angle and a relatively large implantation energy. Consequently, in the extension implantation, most of the implanted ions pass through the thin layer of semiconductive material at the bottom of the trenches 38 so that no amorphous phase occurs in the thin layer of semiconductive material.

Since the trenches 38 provide a window for ion implantation, and the nitride layer 34, the oxide layer 36 and the nitride spacers 37 on the surface of the semiconductor structure provide a hard mask, the above extension implantation, halo implantation and the source/drain implantation can be performed in-situ, which reduces the number of masks needed and simplifies the process steps.

Figure 16:
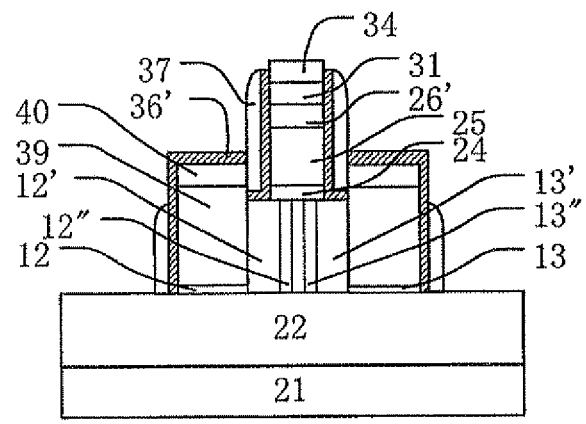

Referring to FIG. 16, the resultant semiconductor structure is subjected to an anneal treatment, for example spike anneal. The anneal treatment is used to activate the dopants injected at the previous implantation steps and to eliminate implant damages.

After the anneal treatment, the doping profile in the fin 23' of semiconductive material is also shown in FIG. 16, which includes a source region 12 and a drain region 13 provided at the bottom of the trenches 38, a source extension 12' adjacent to the source region 12, a drain extension 13' adjacent to the drain region 13, a source halo 12" adjacent to the source extension 12' and extending towards to the central portion of the fin 23', and a drain halo 13" adjacent to the drain extension 13' and extending towards to the central portion of the fin 23'.

Then, by a conventional deposition process, such as PVD, CVD, atomic layer deposition, sputtering and the like, stressors 39 and epitaxial silicon layer 40 are epitaxially grown in sequence in the trenches 38. Due to the epitaxial growth, the stressors 39 form only on the thin layer of semiconductive material at the bottom of the trenches 38. For a p-type MOSFET, the stressors 39 may be made of SiGe which has a Ge content of about 20-50% and is doped with B in-situ, so as to apply a compressive stress to the channel region from the source/drain regions after the epitaxial growth to improve an electrical property of the p-type MOSFET. For an n-type MOSFET, the stressors 39 may be made of Si:C which has a C content of about 0.5-2% and is doped with As or P in-situ, so as to apply a tensile stress to the channel region from the source/drain regions after the epitaxial growth to improve an electrical property of the n-type MOSFET.

Then, the resultant semiconductor structure is subjected to oxidation so that a top of the epitaxial silicon layer 40 is oxidized and provides a thin oxide layer 36' which has a thickness of about 3-10 nm. The epitaxial silicon layer 40 at the top of the stressors 39 is used to provide a high-quality SiO$_2$ layer.

Figure 17:
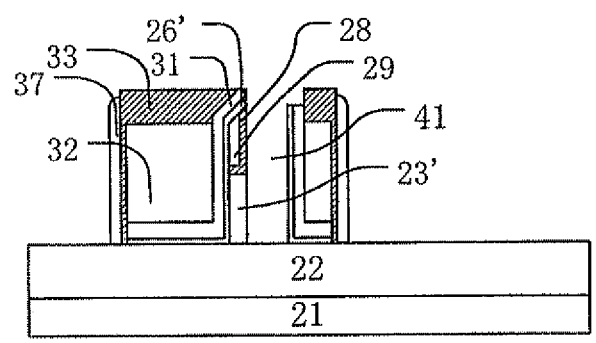
FIGS. 17-21 are cross-sectional views of the structure of the semiconductor device at various stages of the subsequent fabrication process according to an embodiment of the present invention, taken along line A-A' and for illustrating the process steps of forming a channel region.

Referring to FIG. 17, with the oxide layer 33 formed in the step shown in FIG. 8 as a hard mask and the buried oxide layer 22 of the SOI wafer as a stop layer, portions of the metal layer 31, the thin oxide layer 26', the Si layer 25, the SiGe layer 24 and the fin 23' are removed in sequence by dry etching such as ion beam milling, plasma etching, reactive ion etching, laser ablation and the like, so as to provide a trench 41 in a self-aligned manner. Consequently, a thickness of the fin 23' is reduced to be approximately equal to a sum of the thickness of the oxide layer 28 and that of the nitride spacer 29. As mentioned above, the channel region is formed in the fin. Due to the removed materials in the trench, the stress induced in the channel region is enhanced so as to further improve an electrical property of the device.

At the right portion of the sidewall (Le. a portion of the inner wall) of the trench 41, a portion of the stack of the thin oxide layer 26', the metal layer 31, the polysilicon layer 32 and the oxide layer 33 remains. In the manufacture of an integrated circuit including a plurality of MOSFETs having the same structure, the portion of the stack of the thin oxide layer 26', the metal layer 31, the polysilicon layer 32 and the oxide layer 33 at the right portion of the sidewall of the trench 41 may be used to provide a gate, region for a next MOSFET (not shown in FIG. 17), and the insulating filler in the trench 41 may provide a shallow trench isolation.

Moreover, as shown in FIG. 17, the nitride spacers 37 formed in the step shown in FIG. 12 remain at the sidewall of the multilayer gate conductor.

Figure 18:
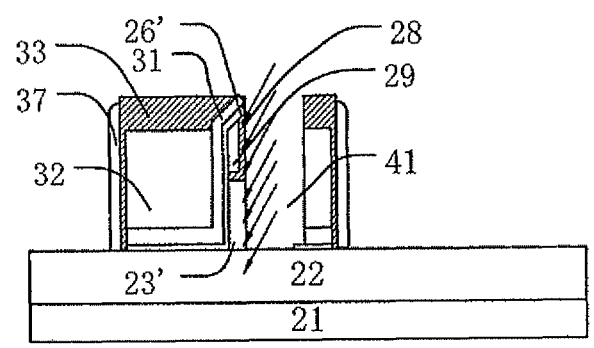

Referring to FIG. 18, by dry etching such as ion beam milling, plasma etching, reactive ion etching, laser ablation and the like, the portions of the thin oxide layer 26' and the metal layer 31 that remain at the sidewall (i. e. the right portion of the sidewall shown in FIG. 18) of the trench 41 are selectively removed relative to the oxide layer 33.

Preferably, ions are implanted into the fin 23' of semiconductive material by an angular ion implantation, followed by an anneal treatment (for example, laser anneal) for activating the dopants, so as to provide a super steep retrograde well (SSRW) 42 in the fin 23' at the side near the trench 41. The trench 41 provides a window for ion implantation. The process for forming SSRW can be found in the following documents:

1) G. G. Shahidi, D. A. Antoniadis and H. I. Smith, IEEE TED Vol. 36, p. 2605, 1989

2) C. Fiegna, H. Iwai, T. Wada, M. Saito, E. Sangiorgi and B. Riccò, IEEE TED Vol. 41, p. 941, 1994.

3) J. B. Jacobs and D. A. Antoniadis, IEEE TED Vol. 42, p. 870, 1995.

4) S. E. Thompson, P. A. Packan and M. T. Bohr, VLSI Tech Symp., p. 154, 1996.

Figure 19:
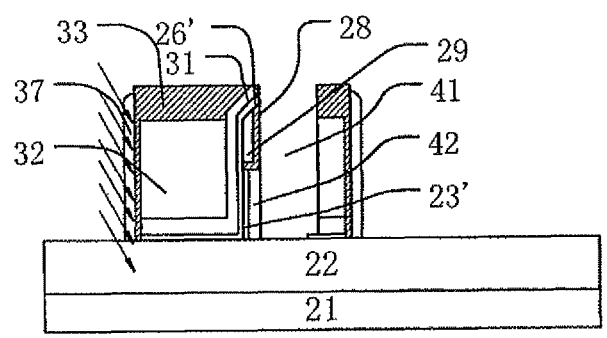
Figure 20:
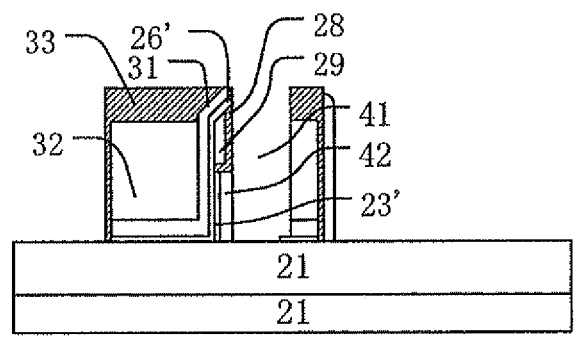

Referring to FIGS. 19 and 20, the spacer 37 at the left side can be removed in three steps. At the first step, with the oxide layer 33 as a mask, an angular ion implantation of Ge is performed so as to cause damages in the spacer at the left side, as shown in FIG. 19. At the second step, the photoresist pattern is removed by ashing or dissolution with a solvent. At the third step, by wet etching or dry etching, the spacer at the left side is selectively removed relative to the spacer at the right side, as shown in FIG. 20.

Figure 21:
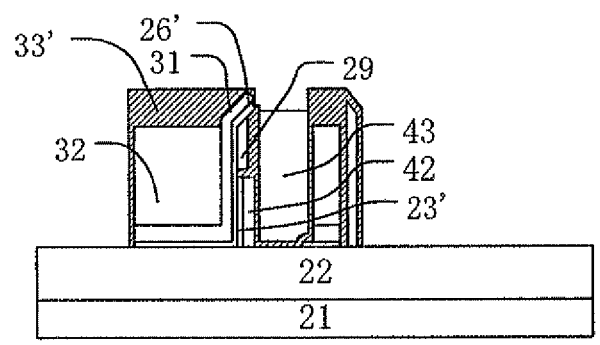

Referring to FIG. 21, for example by CVD, a conformal thin oxide layer 33' which has a thickness of about 2-5 nm is formed on the whole surface of the semiconductor structure. For example by CVD, a nitride is then deposited to a thickness sufficient for filling the trench 41. The nitride layer is selectively etched back relative to the oxide layer 33' so that the portion of the nitride layer around the trench 41 is completely removed and the nitride filler 43 remains in the trench 41.

Figure 22A:
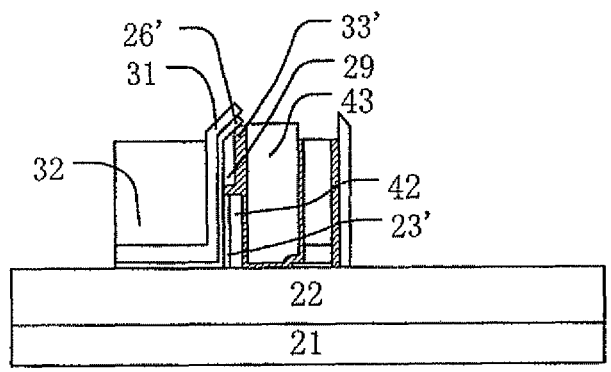
FIGS. 22A, 22B, 23A and 23B are cross-sectional views of the structure of the semiconductor device at various stages of the subsequent fabrication process according to an embodiment of the present invention, taken along line A-A for FIGS. 22A and 23A, line 2-2' for FIGS. 22B and 23B, and for illustrating the process steps of forming a silicide layer on the source/drain regions and the gate.
Figure 22B:
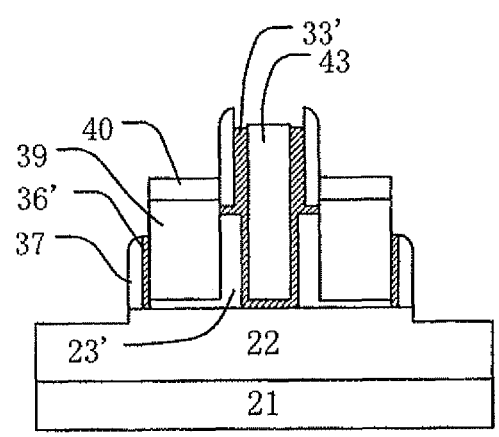

Referring to FIGS. 22A and 22B, by dry etching such as ion beam milling, plasma etching, reactive ion etching, laser ablation and the like, the oxide is selectively removed relative to the nitride filler 43.

The etching step removes completely the portion of the oxide layer 33' that exposes at the main surface of the semiconductor structure, and the portion of the oxide layer 33' that is located at the sidewall and the bottom of the trench is protected by the nitride filler 41 and remains. Consequently, a top surface and a left side of the polysilicon layer 32 of the multilayer gate conductor, and a top surface of the epitaxial silicon layer 40 at the source/drain regions are exposed.

The etching step also removes a portion of the buried oxide layer 22 of the SOI substrate.

Figure 23A:
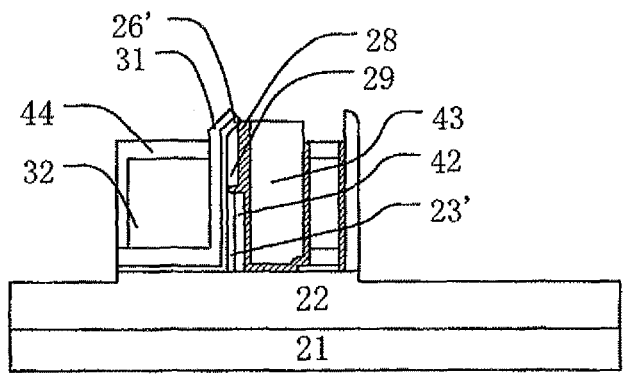
Figure 23B:
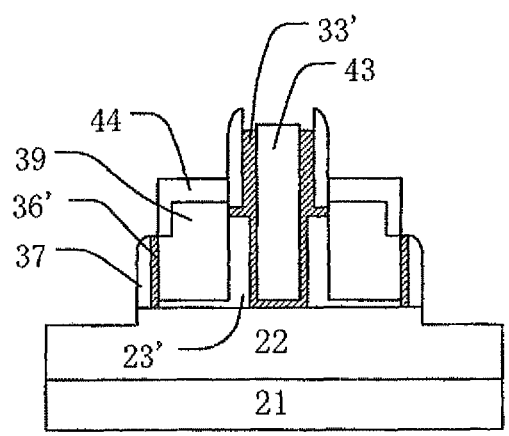

Referring to FIGS. 23A and 23B, by a conventional silicidation process, a portion of the top surface and the left side of the polysilicon layer 32 of the multilayer gate conductor, and at least a portion of the epitaxial silicon layer 40 at the source/drain regions are converted to a silicide layer, so as to minimize a contact resistance between the gates, the source/drain and the corresponding metal contacts.

For example, a Ni layer which has a thickness of about 5-12 nm is firstly deposited, and then subjected to a heat treatment at a temperature in a range of about 300-500° C. for about 1-10 seconds, so that at least a portion of the polysilicon layer 32 and the epitaxial silicon layer 40 is converted to NiSi. Finally, the unreacted Ni is removed by wet etching.

After the steps shown in FIGS. 2-23 are finished, an interlayer insulator may be formed on the resultant semiconductor structure, and vias may be provided therein, wirings and electrical contacts may be provided on an upper surface of the interlayer insulator in conventional processes well known in the art, so that other parts of the semiconductor device are formed.

While the invention has been described with reference to specific embodiments, the description is illustrative of the invention and is not to be considered as limiting the invention. Various modifications and applications may occur for those skilled in the art without departing from the true spirit and scope of the invention as defined by the appended claims.

What is claimed is:

1. A method for manufacturing a semiconductor device, comprising steps of:

a) providing a fin of semiconductive material in a semiconductor layer of a SOI substrate by a self-alignment process, the fin having two opposing sides perpendicular to a main surface of the SOI substrate, wherein the two opposing sides comprise a first side and a second side;

b) providing a stack of gate dielectric and gate conductor on only the first side of the fin, wherein the gate conductor extends laterally away from the first side of the fin in a gate extending direction parallel to the main surface of the SOI substrate;

c) doping the semiconductor material of the fin at its other two opposing sides so as to provide a source region and a drain region, wherein each of the source region and the drain region has a portion extending laterally away from the second side of the fin in a source/drain extending direction parallel to the main surface of the SOI substrate, the source/drain extending direction being opposite to the gate extending direction; and d) providing a channel region at a central portion of the fin.

2. The method according to claim 1, wherein the step a) of providing the fin of semiconductive material comprises steps of:
   providing a stacked structure with a pattern therein on the semiconductor layer;
   providing a conformal oxide layer and a conformal nitride layer on the stacked structure and the whole exposed surface of the semiconductor layer;
   selectively removing a portion of the conformal oxide layer and a portion of the conformal nitride layer so as to leave other portion of the conformal oxide layer and a nitride spacer at one side wall of the stacked structure; and
   with the other portion of the conformal oxide layer, the nitride spacer, and the stacked structure as a hard mask, selectively removing a portion of the semiconductor layer so as to leave the semiconductive material having a first thickness at the central portion of the fin.

3. The method according to claim 2, wherein the step d) of providing the channel region comprises a step of:
   with the other portion of the conformal oxide layer, and the nitride spacer as a hard mask, selectively removing a portion of the stacked structure and a portion of the fin of semiconductive material so as to leave the semiconductive material having a second thickness as the channel region at the central portion of the fin.

4. The method according to claim 1, after the step d) of providing the channel region, further comprising a step of:
   providing a super steep retrograde well in the fin, which is adjacent to the channel region and near the second side.

5. The method according to claim 1, wherein the gate conductor is one selected from a group consisting of a metal layer, a doped polysilicon layer, and a stack of a metal layer and a doped polysilicon layer.

6. The method according to claim 1, between the step c) of providing the source region and drain region and the step d) of providing the channel region, further comprising a step of providing stressors on the source region and the drain region so as to apply stress to each of the source region and the drain region.

7. The method according to claim 6, wherein the step of providing the stressor comprises steps of:
   providing trenches in the source region and the drain region respectively; and
   filling the trenches with the material of the stressors.

8. The method according to claim 7, between the step of providing the trenches and the step of filling the trenches with the material of the stressors, further comprising a step of:
   performing an extension implantation towards the central portion of the fin through the trenches by angled ion implantation so as to provide source and drain extensions.

9. The method according to claim 8, before the step of the extension implantation for the source and drain extensions, further comprising a step of:
   performing a halo implantation towards the central portion of the fin through the trenches by angled ion implantation so as to provide source and drain halos.

10. The method according to claim 9, wherein the extension implantation for the source and drain extensions uses an implantation angle smaller than that used in the halo implantation for the source and drain halos, while using an implantation energy larger than that used in the halo implantation for the source and drain halos.

* * * * *